(12) United States Patent
Wei et al.

(10) Patent No.: US 12,238,871 B2
(45) Date of Patent: Feb. 25, 2025

(54) METHOD FOR MANUFACTURING COMPONENT EMBEDDED CIRCUIT BOARD

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Yong-Chao Wei, Qinhuangdao (CN); Yong-Quan Yang, Qinhuangdao (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 811 days.

(21) Appl. No.: 17/497,809

(22) Filed: Oct. 8, 2021

(65) Prior Publication Data

US 2022/0030720 A1 Jan. 27, 2022

Related U.S. Application Data

(62) Division of application No. 16/550,601, filed on Aug. 26, 2019, now Pat. No. 11,178,777.

(30) Foreign Application Priority Data

Jun. 26, 2019 (CN) .......................... 201910562603.3

(51) Int. Cl.
*H05K 3/46* (2006.01)
*H05K 1/02* (2006.01)
(Continued)

(52) U.S. Cl.
CPC .......... *H05K 3/325* (2013.01); *H05K 1/0243* (2013.01); *H05K 1/165* (2013.01); *H05K 1/186* (2013.01);
(Continued)

(58) Field of Classification Search
CPC ...... H05K 1/0243; H05K 1/185; H05K 1/186; H05K 3/4623; H05K 13/04; H05K 3/4697;
(Continued)

(56) References Cited

U.S. PATENT DOCUMENTS

| 7,839,650 | B2 * | 11/2010 | Hsu | H05K 3/4602 |
| | | | | 361/764 |
| 10,325,856 | B2 * | 6/2019 | Baek | H05K 1/186 |
| 10,356,909 | B1 * | 7/2019 | Hou | H05K 1/185 |

FOREIGN PATENT DOCUMENTS

CN 109411434 A 3/2019

* cited by examiner

*Primary Examiner* — Donghai D Nguyen
(74) *Attorney, Agent, or Firm* — ScienBiziP, P.C.

(57) ABSTRACT

A component embedded circuit board includes a printed circuit board, a dielectric layer, and an antenna structure laminated in that order. The printed circuit board includes a first opening and a first circuit layer, and the first circuit layer includes at least one first connecting pad. A second opening is defined in the dielectric layer. A conductive structure is embedded in the dielectric layer. The second opening penetrates the dielectric layer. The antenna structure includes a first ground layer. A component is embedded in the first opening. One end of the conductive structure is connected to the first ground layer, and the other end of the conductive structure is connected to the first connecting pad. The second opening corresponds to the first opening. A gap is generated by the second opening and the component. A method for manufacturing the package circuit structure is also disclosed.

10 Claims, 7 Drawing Sheets

(51) Int. Cl.
  *H05K 1/16*     (2006.01)
  *H05K 1/18*     (2006.01)
  *H05K 3/10*     (2006.01)
  *H05K 3/32*     (2006.01)
  *H05K 13/04*    (2006.01)

(52) U.S. Cl.
  CPC ............ *H05K 3/103* (2013.01); *H05K 3/321* (2013.01); *H05K 3/4623* (2013.01); *H05K 13/04* (2013.01); *H05K 3/4697* (2013.01); *H05K 2201/10098* (2013.01)

(58) Field of Classification Search
  CPC ....... H05K 2201/10098; H05K 1/0204; H05K 2203/061; Y10T 29/4913; Y10T 29/49146; H01L 23/315; H01L 2224/02331
  See application file for complete search history.

METHOD FOR MANUFACTURING COMPONENT EMBEDDED CIRCUIT BOARD

FIELD

The present disclosure relates to a method for manufacturing a component embedded circuit board with an antenna structure.

BACKGROUND

Electronic devices may have circuit boards. When the electronic device becomes lighter and thinner, the circuit structure may also need to become smaller. Thus, the electronic component (such as a resister, a capacitor, etc.) may be embedded into the circuit board to reduce the overall thickness of the circuit board. However, the electronic component may be damaged during the process of embedding the electronic component in the circuit board.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION OF EMBODIMENTS

Figure 1:
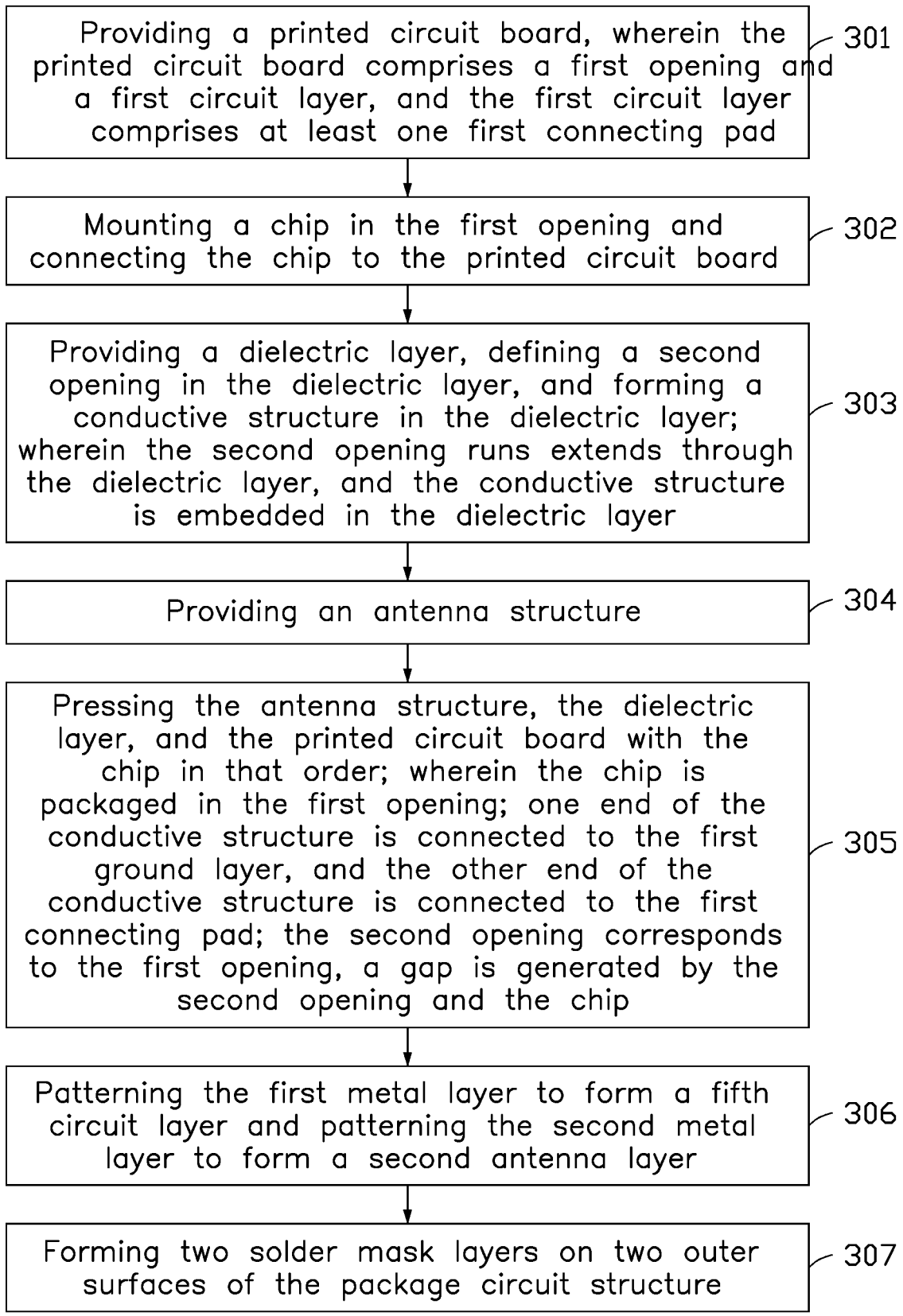
FIG. 1 is a flowchart of a method for manufacturing a component embedded circuit board with an antenna structure in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure Several definitions that apply throughout this disclosure will now be presented.

The term "comprising," when utilized, means "including, but not necessarily limited to"; it specifically indicates open-ended inclusion or membership in the so-described combination, group, series, and the like.

FIG. 1 illustrates a flow chart of a method for manufacturing a component embedded circuit board 100 in accordance with an embodiment of the present disclosure. The example method is provided by way of example, as there are a variety of ways to carry out the method. The method described below can be carried out using the configurations illustrated in FIGS. 2-16, for example, and various elements of these figures are referenced in explaining example method. Each block shown in FIG. 1 represents one or more processes, methods, or subroutines, carried out in the example method. Additionally, the illustrated order of blocks is by example only and the order of the blocks can change. The example method can begin at block 301.

Figure 2:
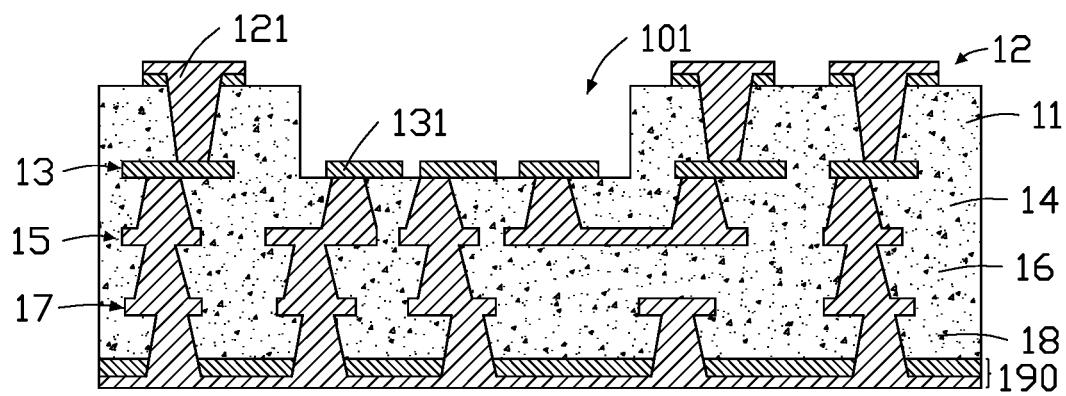
FIG. 2 is a cross-sectional view of a printed circuit board of the component embedded circuit board of FIG. 1.

At block 301, referring to FIG. 2, a printed circuit board 10 is provided. The printed circuit board 10 includes a first dielectric layer 11, a first circuit layer 12, and a second circuit layer 13. The first dielectric layer 11 includes a first surface 111 and a second surface 112 opposite to the first surface 111. The first circuit layer 12 is formed on the first surface 111. The second circuit layer 13 is formed on the second surface 112. The first circuit layer 12 is electrically connected to the second circuit layer 13. A first opening 101 is defined in the first dielectric layer 11. A part of the second circuit layer 13 is exposed from the first opening 101.

In the embodiment, the first circuit layer 12 includes at least one first connecting pad 121. The second circuit layer 13 includes at least one second connecting pad 131. The second connecting pad 131 is exposed from the first opening 101.

In the embodiment, the printed circuit board 10 further includes other dielectric layers and other circuit layers or metal layers that are formed on one side of the second circuit layer 13 away from the first circuit layer 12. The other circuit layers are electrically connected to the second circuit layer 13.

In the embodiment, the printed circuit board 10 further includes a second dielectric layer 14, a third circuit layer 15, a third dielectric layer 16, a fourth circuit layer 17, a fourth dielectric layer 18, and a first metal layer 190, which are laminated in that order. The second circuit layer 13 is formed on the second dielectric layer 14 and is opposite to the third circuit layer 15. The second circuit layer 13 is electrically connected to the third circuit layer 15. The third circuit layer 15 is electrically connected to the fourth circuit layer 17.

In the embodiment, a wiring density of the printed circuit board 10 gradually decreases from the second circuit layer 13 in a direction away from the first circuit layer 12.

Figure 3:
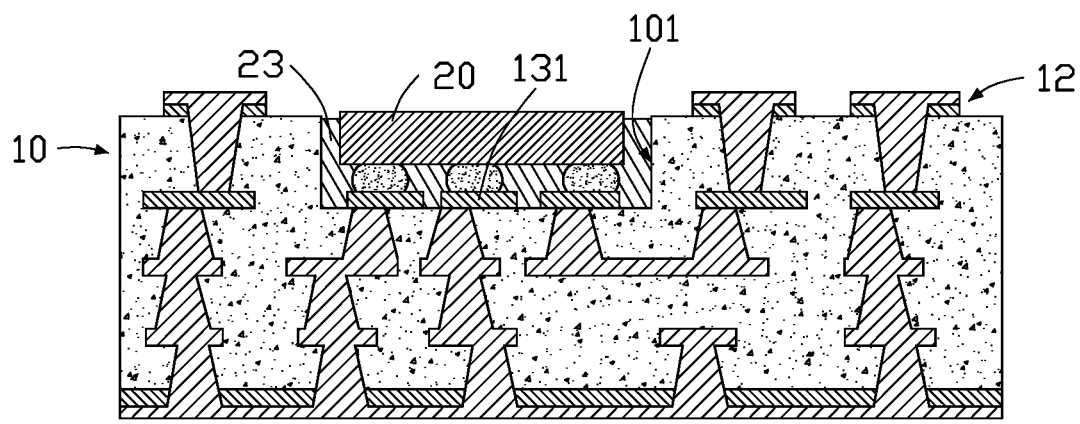
FIG. 3 is a cross-sectional view of the printed circuit board with a component mounted in the printed circuit board of FIG. 1.

At block 302, referring to FIG. 3, a component 20 is mounted in the first opening 101 and connects to the second connecting pad 131. An adhesive 23 is filled into the first opening 101 to bond the component 20 and the printed circuit board 10 together.

In at least one embodiment, the component 20 does not protrude out from the first circuit layer 12. In the embodiment, the component 20 is lower than or is flush with the first opening 101. In other embodiment, the component 20 protrudes out from the first circuit layer 12.

In the embodiment, the adhesive 23 further reinforces the component 20 and the printed circuit board 10. In the embodiment, the adhesive 23 is made from thermally conductive adhesive material to accelerate the diffusion of heat from the component 20 and facilitate heat dissipation.

In other embodiments, the step of injecting the adhesive 23 may also be omitted.

Figure 4:
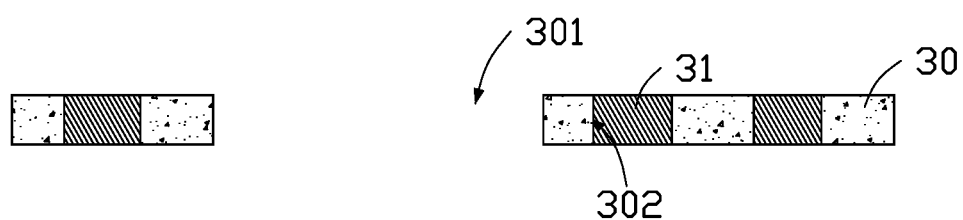
FIG. 4 is a cross-sectional view of a dielectric layer of the component embedded circuit board of FIG. 1.

At block 303, referring to FIG. 4, a dielectric layer 30 is provided. A second opening 301 and a conductive structure 31 are defined in the dielectric layer 30. The second opening 301 penetrates the dielectric layer 30. The conductive structure 31 is embedded in the dielectric layer 30.

In the embodiment, at least one through hole 302 is defined in the dielectric layer 30. The through hole 302 penetrates the dielectric layer 30. A conductive paste is infilled in the through hole 302 to form the conductive structure 31. The conductive paste has good electrical conductivity and adhesiveness. When the dielectric layer 30 is pressed together with other components, the conductive paste allows good electrical and heat conduction, and connects to other components.

In other embodiments, the conductive structure 31 can be made from a conductive adhesive, a metal deposit layer, or other materials.

In the embodiment, the dielectric layer 30 includes three conductive structures 31.

Figure 5:
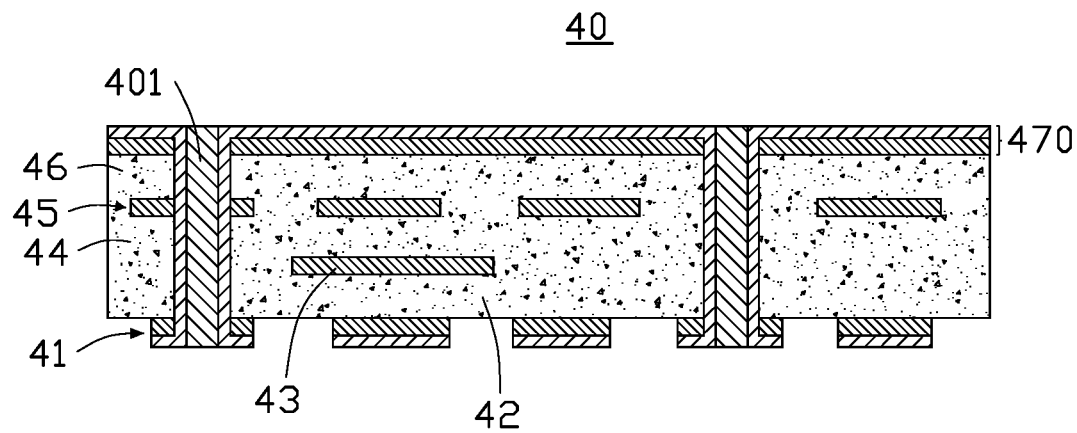
FIG. 5 is a cross-sectional view of an antenna structure of the component embedded circuit board of FIG. 1.

At block 304, referring to FIG. 5, an antenna structure 40 is provided, the antenna structure 40 includes a first ground layer 41, a first insulating layer 42, and a first antenna layer 43, which are laminated in that order.

In at least one embodiment, the antenna structure 40 further includes a second insulating layer 44, a second ground layer 45, a third insulating layer 46, and a second metal layer 470, which are laminated in that order. The first ground layer 41 is electrically connected to the second ground layer 45 and the second metal layer 470.

In the embodiment, the antenna structure 40 includes at least one conductive column 401. The conductive column 401 is spaced apart and penetrate the first ground layer 41, the first insulating layer 42, the second insulating layer 44, the second ground layer 45, and the third insulating layer 46. The conductive column 401 is electrically connected to the first ground layer 41, the second ground layer 45, and the second metal layer 470.

In other embodiments, an inner ground layer (not shown), an inner insulating layer (not shown), and an inner antenna layer (not shown) may be formed between the first antenna layer 43 and the second ground layer 45. Projections of the first antenna layer 43 and the inner antenna layer in direction of laminating do not overlap with each other.

The first insulating layer 42, the second insulating layer 44, the third insulating layer 46, and the inner insulating layer have a low dielectric constant ($D_k$) and a low dielectric loss factor ($D_f$). In the embodiment, $D_k$ of the antenna structure 40 is less than 3.0, and $D_f$ is less than 0.2.

Figure 6:
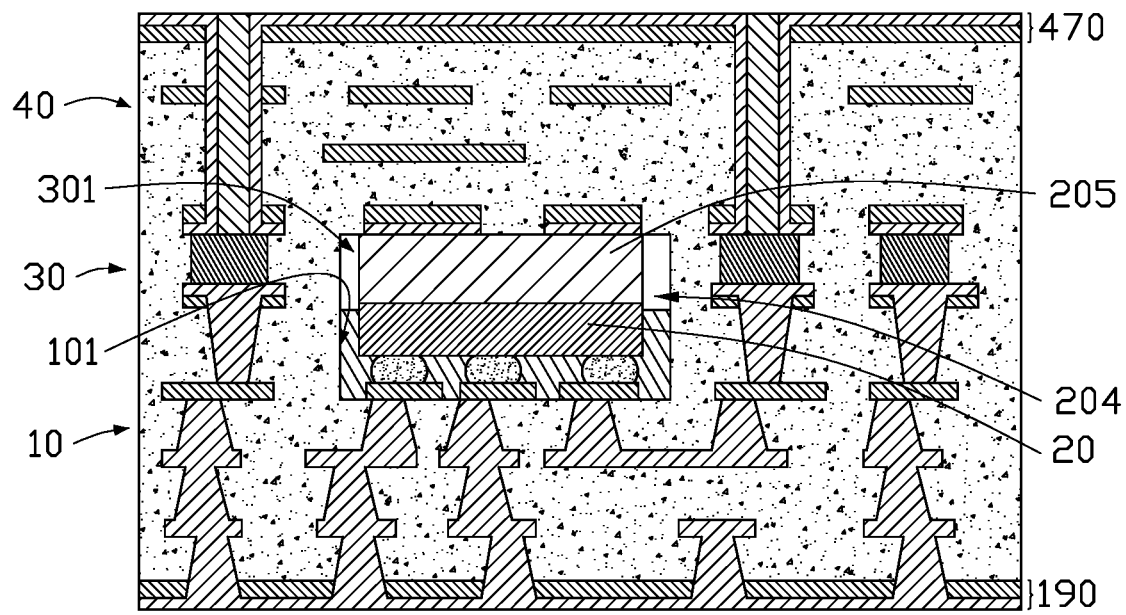
FIG. 6 is a cross-sectional view of an intermediate package formed by pressing the antenna structure of FIG. 5, the dielectric layer of FIG. 4, and the printed circuit board of FIG. 3.

At block 305, referring to FIG. 6, the antenna structure 40, the dielectric layer 30, and the printed circuit board 10 with the component 20 are pressed in that order to produce a component embedded circuit board 100. The component 20 is packaged in the first opening 101.

The dielectric layer 30 is formed on the first circuit layer 12 and the first ground layer 41 is formed on the dielectric layer 30. One end of the conductive structure 31 is connected to the first ground layer 41, and the other end of the conductive structure 31 is connected to the first connecting pad 121. The second opening 301 corresponds to the first opening 101, so that a gap 204 generated by the second opening 301 exists between the component 20 and the antenna structure 40.

In other embodiments, a thermal-dissipating component 205 having a good dissipation effect is formed in the gap 204 to accelerate heat dissipation from the component 20. The thermal-dissipating component 205 is formed between the component 20 and the antenna structure 40.

In the embodiment, the conductive column 401 is formed to correspond to the conductive structure 31.

In the embodiment, the method for manufacturing the component embedded circuit board 100 further includes block 306 and block 307.

Figure 7:
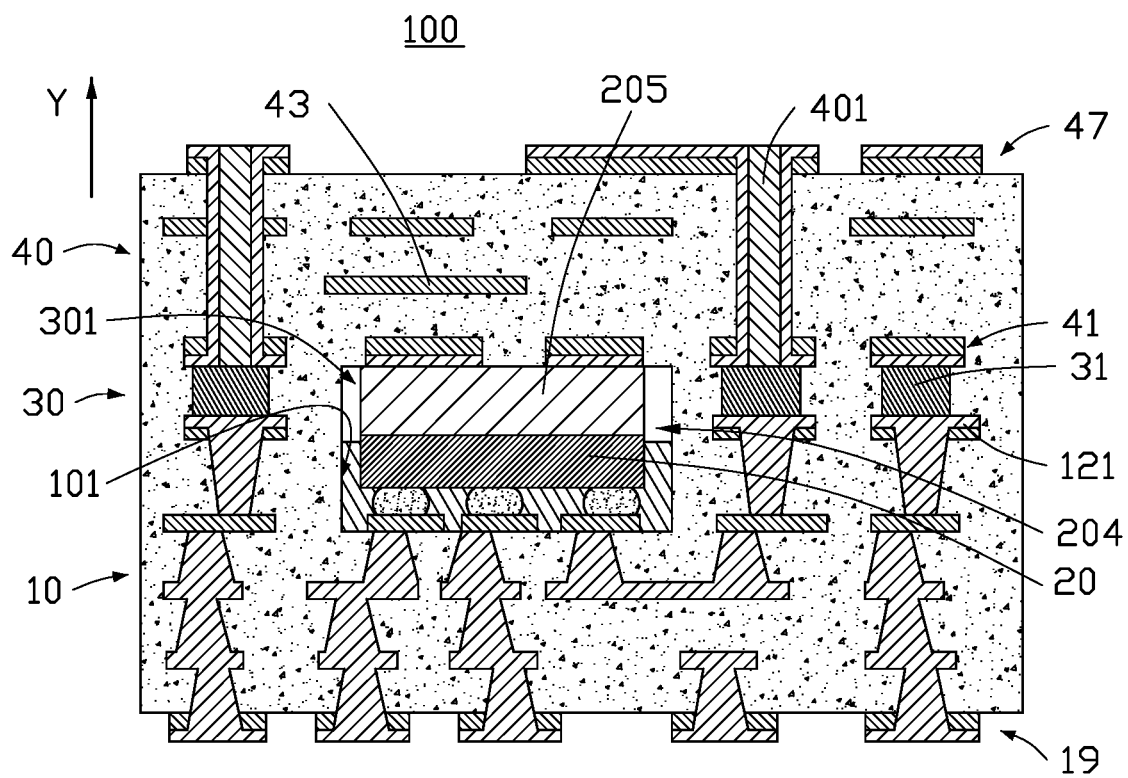
FIG. 7 is a cross-sectional view of the component embedded circuit board of FIG. 1.

At block 306, referring to FIG. 6 and FIG. 7, the first metal layer 190 is patterned to form a fifth circuit layer 19, and the second metal layer 470 is patterned to form a second antenna layer 47. Projections of the second antenna layer 47 and the first antenna layer 43 in direction of laminating do not overlap with each other.

Figure 8:
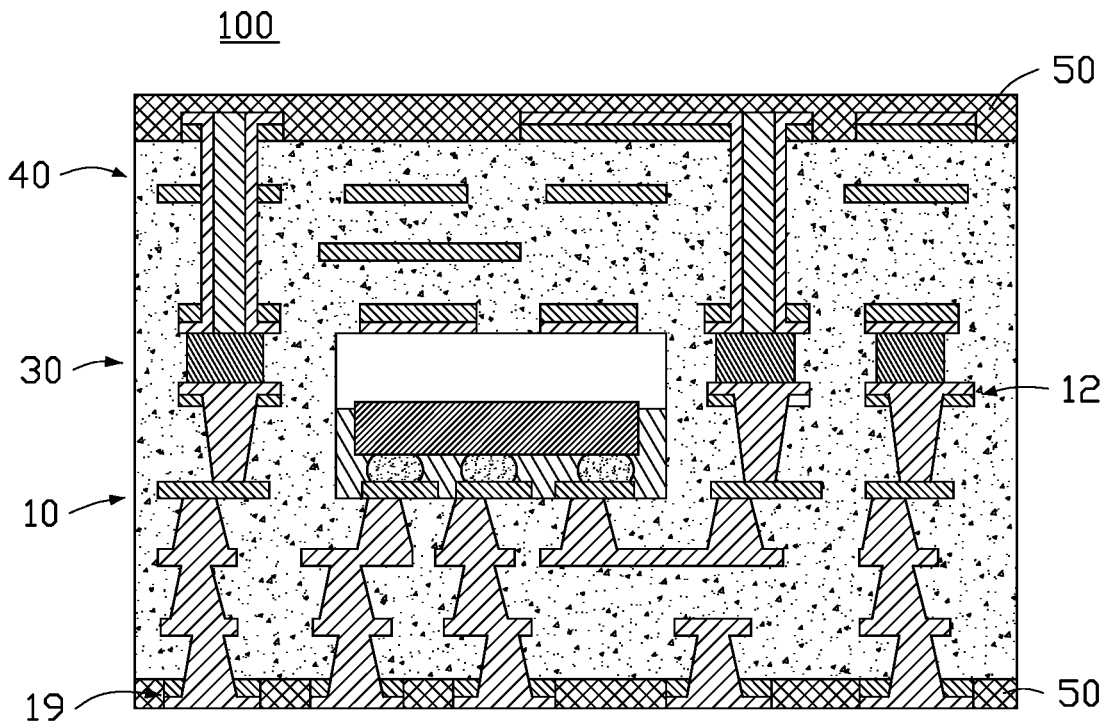
FIG. 8 is a cross-sectional view of the component embedded circuit board with solder mask layers.

At block 307, referring to FIG. 8, two solder mask layers 50 are formed on two outer surfaces of the component embedded circuit board 100. A part of the outermost circuit layer of the printed circuit board 10 is exposed from the solder mask layer 50, and is used to connect to other electronic components.

In the embodiment, a part of the fifth circuit layer 19 is exposed from the solder mask layer 50.

In other embodiments, the first metal layer 190 and the second metal layer 470 are patterned to form the fifth line layer 19 and the second antenna layer 47 before the antenna structure 40, the dielectric layer 30, and the printed circuit board 10 are pressed together. The projections of the second antenna layer 47 and the first antenna layer 43 in direction of laminating do not overlap with each other.

After the antenna structure 40, the dielectric layer 30, and the printed circuit board 10 are pressed together, the method of manufacturing the component embedded circuit board 100 further includes setting solder mask layers 50 on two outer surfaces of the component embedded circuit board 100. A part of the outermost circuit layer of the printed circuit board 10 is exposed from the solder mask layer 50, and is used to connect to other electronic components.

In the component embedded circuit board 100, an antenna structure 40, a dielectric layer 30, and a printed circuit board 10 are stacked in that order.

The second antenna layer 47 is located at an outermost side of the antenna structure 40 facing away from the dielectric layer 30. The second antenna layer 47 is electrically connected to the first ground layer 41 and the conductive structure 31 by the conductive column 401. One side of the conductive structure 31 away from the conductive column 401 is electrically connected to the first circuit layer 12, and the first circuit layer 12 is electrically connected to the second circuit layer 13 to achieve conduction between the second antenna layer 47 and the component 20.

Figure 9:
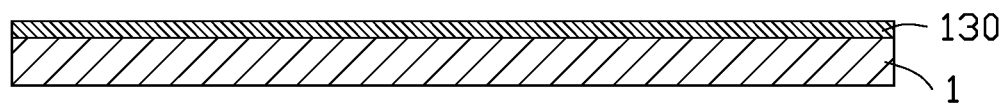
FIG. 9 is a cross-sectional view of a carrier board with a first metal foil.

In the embodiment, the method for manufacturing the printed circuit board 10 includes:

At block 311, referring to FIG. 9, a carrier board 1 is provided, and a first metal foil 130 is formed on a surface of the carrier board 1.

Figure 10:
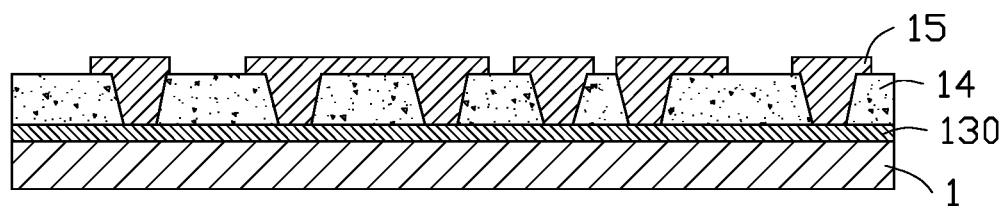
FIG. 10 is a cross-sectional view showing a second dielectric layer formed on the first metal foil of FIG. 9 and a third circuit layer formed on the second dielectric layer.

At block 312, referring to FIG. 10, a second dielectric layer 14 is pressed on the first metal foil 130, and a third circuit layer 15 is formed on a surface of the second dielectric layer 14 away from the first metal foil 130.

Figure 11:
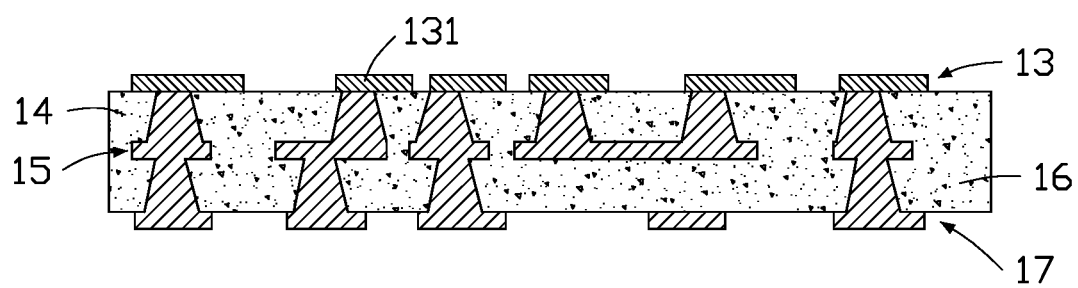
FIG. 11 is a cross-sectional view showing a third dielectric layer pressed on the third circuit layer, a fourth circuit layer formed on one side of the third dielectric layer away from the third circuit layer, the carrier board removed, and the first metal foil patterned to form a second circuit layer.

At block 313, referring to FIG. 11, a third dielectric layer 16 is pressed on the third circuit layer 15. A fourth circuit layer 17 is formed on one side of the third dielectric layer 16 away from the third circuit layer 15, the carrier board 1 is removed, and the first metal foil 130 is patterned to form a second circuit layer 13. The second circuit layer 13 includes at least one second connecting pad 131.

Figure 12:
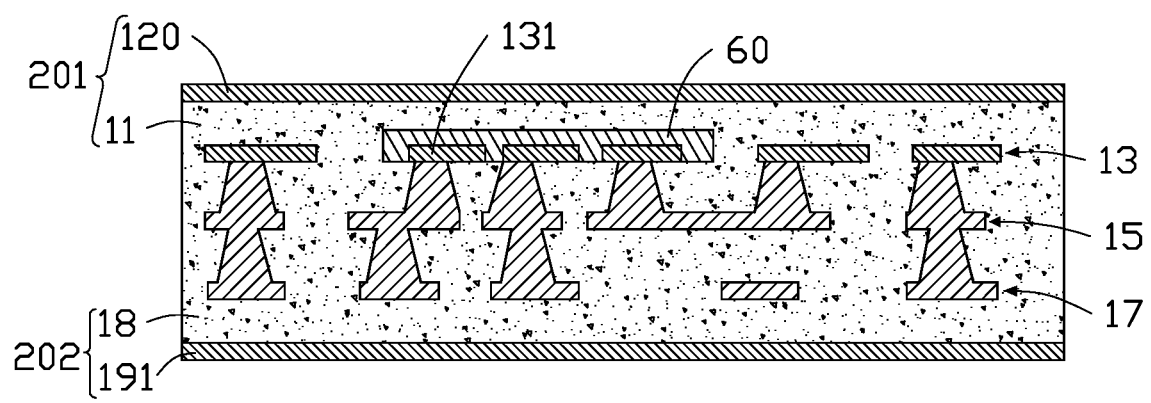
FIG. 12 is a cross-sectional view showing a solder mask structure formed on the second connecting pad of FIG. 11, a first single-sided copper clad laminate pressed on the second circuit layer of FIG. 11, and a second single-sided copper clad laminate pressed on the on the fourth circuit layer of FIG. 11.

At block 314, referring to FIG. 12, a solder mask structure 60 is formed on the second connecting pad 131. A first single-sided copper clad laminate 201 is pressed on the second circuit layer 13, and a second single-sided copper clad laminate 202 is pressed on the on the fourth circuit layer 17.

The first single-sided copper clad laminate 201 includes a first dielectric layer 11 and a second metal foil 120 formed on a surface of the first dielectric layer 11. The first dielectric layer 11 covers the second circuit layer 13 and the solder mask structure 60. The single-sided copper clad laminate 202 includes a fourth dielectric layer 18 formed on the fourth circuit layer 17 and a third metal foil 191 formed on a surface of the fourth dielectric layer 18.

At block 315, referring to FIG. 2, the second metal foil 120 is patterned to form a first circuit layer 12. A first opening 101 is defined on the first dielectric layer 11 to expose the second connection pad 131, and the third metal foil 191 is punctured and plated to form a first metal layer 190. The first metal layer 190 is electrically connected to the fourth circuit layer 17.

Figure 13:
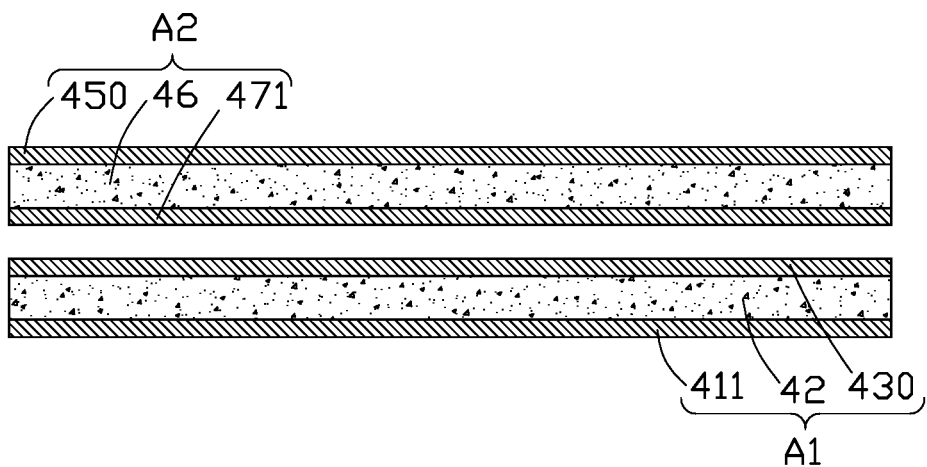
FIG. 13 is a cross-sectional view of a first double panel and a second double panel.

In the embodiment, the method for manufacturing the antenna structure 40 includes:

At block 341, referring to FIG. 13, a first double panel $A_1$ and a second double panel $A_2$ are provided.

The first double panel $A_1$ includes a first insulating layer 42, a first conductive layer 411, and a second conductive layer 430. The first conductive layer 411 and the second conductive layer 430 are formed on two opposite surfaces of the first insulating layer 42.

The second double-sided panel $A_2$ includes a third insulating layer 46, a third conductive layer 450, and a fourth conductive layer 471. The third conductive layer 450 and the fourth conductive layer 471 are formed on two opposite surfaces of the third insulating layer 46.

Figure 14:
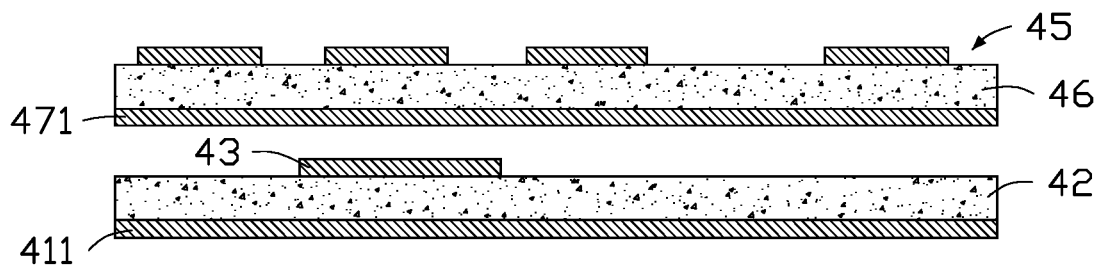
FIG. 14 is a cross-sectional view showing the second conductive layer patterned to form a first antenna layer and the third conductive layer patterned to form a second ground layer.

At block 342, referring to FIG. 14, the second conductive layer 430 is patterned to form a first antenna layer 43 and the third conductive layer 450 is patterned to form a second ground layer 45.

Figure 15:
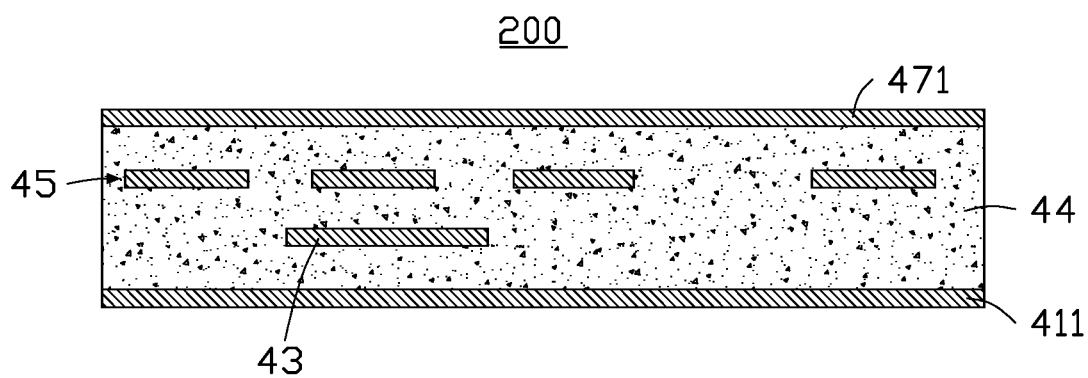
FIG. 15 is a cross-sectional view of an intermediate body after pressing the first double panel of FIG. 14, a second insulating layer, and the second double panel of FIG. 14.

At block 343, referring to FIGS. 14-15, the first double panel $A_1$ with the first antenna layer 43, a second insulating layer 44, and the second double panel $A_2$ with the second ground layer 45 are pressed together to form an intermediate body 200.

The first antenna layer 43 and the second ground layer 45 are formed on two opposite surfaces of the second insulating layer 44.

Figure 16:
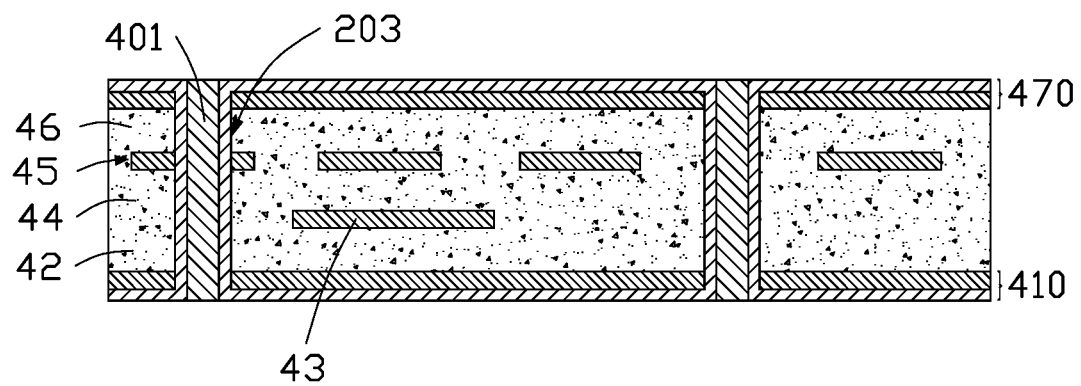
FIG. 16 is a cross-sectional view showing at least one hole defined in the intermediate body.

At block 344, referring to FIGS. 14-16, at least one hole 203 is defined in the intermediate body 200. A third metal layer 410 is formed by plating on the first conductive layer 411 and an inner surface of the hole 203, and a second metal layer 470 is formed by plating on the fourth conductive layer 471 and an inner surface of the hole 203. The hole 203 is infilled with plating to form at least one conductive column 401.

The conductive column 401 penetrates the third metal layer 410, the first insulating layer 42, the first antenna layer 43, the second insulating layer 44, the second ground layer 45, the third insulating layer 46, and the second metal layer 470.

At block 345, referring to FIG. 5, the first ground layer 41 is formed by patterning the third metal layer 410. The conductive column 401 penetrates the first ground layer 41, the first insulating layer 42, the first antenna layer 43, the second insulating layer 44, the second ground layer 45, the third insulating layer 46, and the second metal layer 470.

Figure 17:
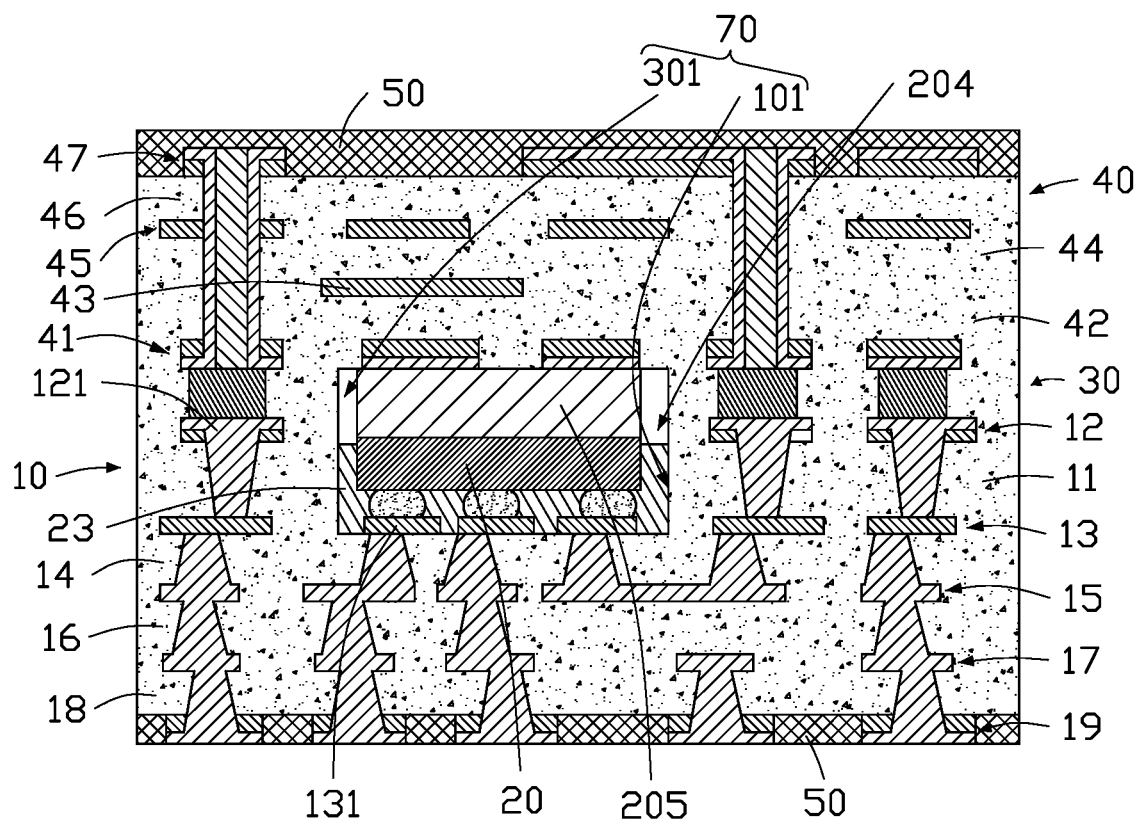
FIG. 17 is a cross-sectional view of the component embedded circuit board of FIG. 1.

Referring to FIG. 17, a component embedded circuit board 100 is provided. The component embedded circuit board 100 includes a printed circuit board 10, a dielectric layer 30, and an antenna structure 40, which are laminated in that order. The printed circuit board 10 includes a first circuit layer 12, a first dielectric layer 11, and a second circuit layer 13, which are laminated in that order. The first circuit layer 12 includes at least one first connecting pad 121. The second circuit layer 13 includes at least one second connecting pad 131. A first opening 101 is defined in the first dielectric layer 11. The second connecting pad 131 is exposed from the first opening 101.

The antenna structure 40 includes a first ground layer 41, a first insulating layer 42 and a first antenna layer 43 which are laminated in that order. The dielectric layer 30 is formed on the first circuit layer 12 and the first ground layer 41 is formed on the dielectric layer 30. A second opening 301 and a conductive structure 31 are defined in the dielectric layer 30. The second opening 301 penetrates the dielectric layer 30. The conductive structure 31 is embedded in the dielectric layer 30. One end of the conductive structure 31 is connected to the first ground layer 41, and the other end of the conductive structure 31 is connected to the first connecting pad 121. The second opening 301 corresponds to the first opening 101 and forms a receiving cavity 70.

The component embedded circuit board 100 further includes a component 20. The component 20 is mounted in the receiving cavity 70 and connects to the second connecting pad 131.

A gap 204 generated by the second opening 301 exists between the component 20 and the antenna structure 40.

In at least one embodiment, the component 20 does not protrude out from the first circuit layer 12. In the embodiment, the component 20 is lower than or is flush with the first opening 101. In other embodiment, the component 20 protrudes out from the first circuit layer 12.

The component embedded circuit board 100 further includes an adhesive 23 formed in the first opening 101 to bond the component 20 and the printed circuit board 10.

In the embodiment, the adhesive 23 is made from an adhesive material.

In other embodiments, a heat-dissipating component 205 having a good heat dissipation effect is formed in the gap 204 to accelerate heat dissipation from the component 20. The thermal-dissipating component 205 is formed between the component 20 and the antenna structure 40.

In at least one embodiment, the antenna structure 40 further includes a second insulating layer 44, a second ground layer 45, a third insulating layer 46, and a second antenna layer 47 laminated in that order. The second insulating layer 44 is bonded to the first antenna layer 43.

Projections of the second antenna layer 47 and the first antenna layer 43 in direction of laminating do not overlap with each other.

In other embodiments, the antenna structure 40 further includes an inner antenna layer (not shown) formed between the first antenna layer 43 and the second ground layer 45 to enhance signal transmission.

Projections of the first antenna layer 43 and the inner antenna layer in direction of laminating do not overlap with each other.

The antenna structure 40 further includes at least one conductive column 401. The conductive column 401 is spaced apart and penetrate the first ground layer 41, the first insulating layer 42, the second insulating layer 44, the second ground layer 45, the third insulating layer 46, and the second metal layer 470.

In the embodiment, the printed circuit board 10 further includes other circuit layers or metal layers formed on one side of the second circuit layer 13 away from the first circuit layer 12. The other circuit layers are electrically connected to the second circuit layer 13.

In the embodiment, the printed circuit board 10 further includes a second dielectric layer 14, a third circuit layer 15, a third dielectric layer 16, a fourth circuit layer 17, a fourth dielectric layer 18, and a fifth circuit layer 19 laminated in that order. The second dielectric layer 14 is formed on the second circuit layer 13. The second circuit layer 13 is electrically connected to the third circuit layer 15. The third circuit layer 15 is electrically connected to the fourth circuit layer 17.

In the embodiment, the component embedded circuit board 100 further includes two solder mask layers 50 formed on two outer surfaces of the component embedded circuit board 100.

In the component embedded circuit board 100 of the present disclosure, the dielectric layer 30 of the component embedded circuit board 100 is provided with a second opening 301 corresponding to the component 20, so that the component 20 is in communication with the antenna structure 40. This aids heat dissipation from the component 20, and avoids damage or component displacement of the component 20 during pressing. Further, a thermal-dissipating component 205 is formed between the component 20 and the antenna structure 40 to accelerate heat dissipation from the component 20. Further, the adhesive 23 in the first opening 101 reinforces the component 20 and the printed circuit board 10. The adhesive 23 is made from an adhesive material with good thermal conductivity which accelerates heat dissipation from the component 20. Further, the projections of the first antenna layer 43 and the second antenna layer 47 in direction of laminating do not overlap with each other, which is advantageous for signal transmission. At the same time, the antenna structure 40 is capable of integrating a plurality of signals and can be set layered.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for manufacturing a component embedded circuit board, comprising:
   providing a printed circuit board, wherein the printed circuit board comprises a first opening and a first circuit layer, and the first circuit layer comprises at least one first connecting pad;
   mounting a component in the first opening and conductively connecting the component to the printed circuit board;
   providing a dielectric layer, defining a second opening in the dielectric layer, and embedding a conductive structure in the dielectric layer; wherein the second opening penetrates the dielectric layer;
   providing an antenna structure; wherein the antenna structure comprises a first ground layer; and
   pressing the antenna structure, the dielectric layer, and the printed circuit board with the component in that order; wherein the component is embedded in the first opening; one end of the conductive structure is connected to the first ground layer, and the other end of the conductive structure is connected to the first connecting pad; the second opening corresponds to the first opening, a gap is generated by the second opening and the component.

2. The method of claim 1, wherein connecting the component to the printed circuit board further comprises:
   filling an adhesive into the first opening to fix the component and the printed circuit board together.

3. The method of claim 1, further comprising:
   forming a thermal-dissipating component in the gap, wherein the thermal-dissipating component is formed between the component and the antenna structure.

4. The method of claim 1, wherein the antenna structure further comprises a first insulating layer and a first antenna layer; the first ground layer, a first insulating layer, and a first antenna layer are laminated in that order.

5. The method of claim 4, wherein the antenna structure further comprises a second insulating layer, a second ground layer, a third insulating layer, and a second antenna layer laminated in that order; the second insulating layer is formed on the first antenna layer.

6. The method of claim 5, wherein projections of the second antenna layer and the first antenna layer in a laminating direction do not overlap with each other.

7. The method of claim 5, wherein the antenna structure further comprises at least one conductive column, the conductive column penetrates the first ground layer, the first insulating layer, the first antenna layer, the second insulating layer, the second ground layer, the third insulating layer, and the second antenna layer.

8. The method of claim 1, wherein two solder mask layers are formed on two outer surfaces of the component embedded circuit board, respectively.

9. The method of claim 1, wherein the printed circuit board comprises a first circuit layer, a first dielectric layer, and a second circuit layer laminated in that order; the dielectric layer is formed on the first circuit layer; the first opening is defined in the first dielectric layer; the second circuit layer comprises at least one second connecting pad, the second connecting pad is exposed from the first opening; and the component is electrically connected to the second connecting pad.

10. The method of claim 1, wherein at least one through hole is defined in the dielectric layer, the through hole penetrates the dielectric layer, and the conductive structure is filled into the through hole.

* * * * *